United States Patent
Walpole et al.

(10) Patent No.: US 7,106,773 B1
(45) Date of Patent: *Sep. 12, 2006

(54) LARGE MODAL VOLUME SEMICONDUCTOR LASER SYSTEM WITH SPATIAL MODE FILTER

(76) Inventors: James N. Walpole, 58 Allen Farm La., Concord, MA (US) 01742; Kenneth W. Nill, 16 Bennington Rd., Lexington, MA (US) 02421

( * ) Notice: Subject to any disclaimer, the term of this patent is extended or adjusted under 35 U.S.C. 154(b) by 0 days.

This patent is subject to a terminal disclaimer.

(21) Appl. No.: 10/963,328

(22) Filed: Oct. 12, 2004

Related U.S. Application Data

(63) Continuation of application No. 10/055,872, filed on Jan. 23, 2002, now Pat. No. 6,804,281.

(60) Provisional application No. 60/263,683, filed on Jan. 23, 2001.

(51) Int. Cl.
*H01S 5/00* (2006.01)
(52) U.S. Cl. ............... 372/45.01; 372/46.01
(58) Field of Classification Search ............ 372/38.02, 372/108, 98, 75, 43.01, 50.1, 46.011
See application file for complete search history.

(56) References Cited

U.S. PATENT DOCUMENTS

| | | | |
|---|---|---|---|
| 4,432,091 A | 2/1984 | Kuroda et al. | |
| 4,789,881 A | 12/1988 | Alphonse | |
| 4,793,679 A * | 12/1988 | Toda et al. | 385/39 |
| 4,821,277 A | 4/1989 | Alphonse et al. | |
| 4,958,355 A | 9/1990 | Alphonse et al. | |
| 5,396,481 A * | 3/1995 | Uchida | 369/121 |
| 6,122,299 A | 9/2000 | DeMars et al. | |
| 6,184,542 B1 | 2/2001 | Alphonse | |
| 6,339,606 B1 * | 1/2002 | Alphonse | 372/50.1 |
| 6,417,524 B1 | 7/2002 | Alphonse | |
| 6,430,207 B1 * | 8/2002 | Alphonse | 372/98 |
| 6,928,223 B1 | 8/2005 | Walpole et al. | |
| 2002/0051615 A1 | 5/2002 | Walpole et al. | |
| 2002/0071470 A1 | 6/2002 | Goto | |

* cited by examiner

*Primary Examiner*—Minsun Oh Harvey
*Assistant Examiner*—Tuan N. Nguyen
(74) *Attorney, Agent, or Firm*—Houston Eliseeva, LLP

(57) ABSTRACT

A semiconductor optical amplification system that uses a single-mode fiber angle-coupled to a semiconductor waveguide medium with optical gain. This design is particularly simple and relevant to optical fiber systems, but it may be generalized to include other implementations as well, in which other spatial mode filters are employed. A chip design is employed in which lowest order mode has a size greater than about 5 micrometers (μm). Thus, much smaller facet angles can be employed while still avoiding self-oscillation. More specifically, according to some aspects of the invention, facet angles of less than 4 to 5 degrees are utilized.

19 Claims, 8 Drawing Sheets

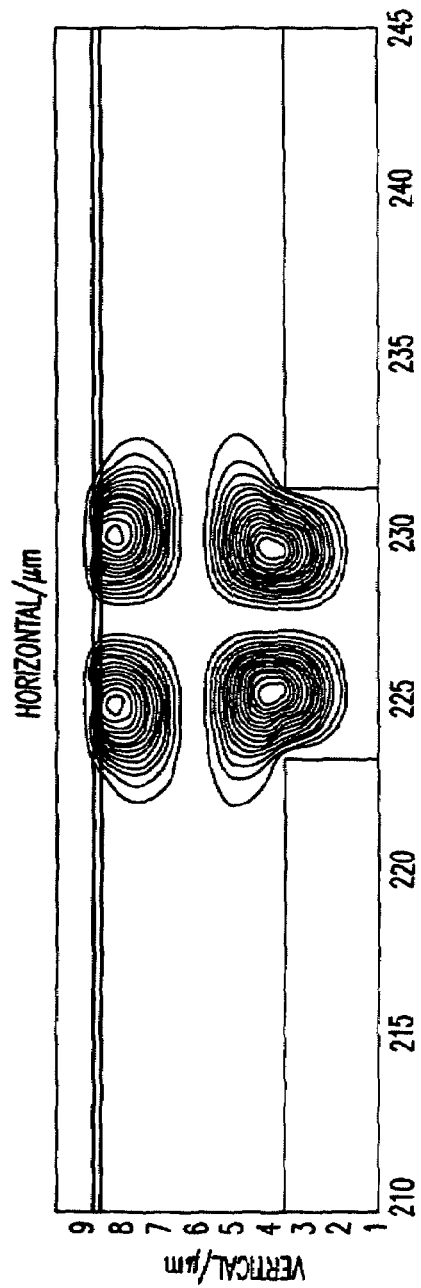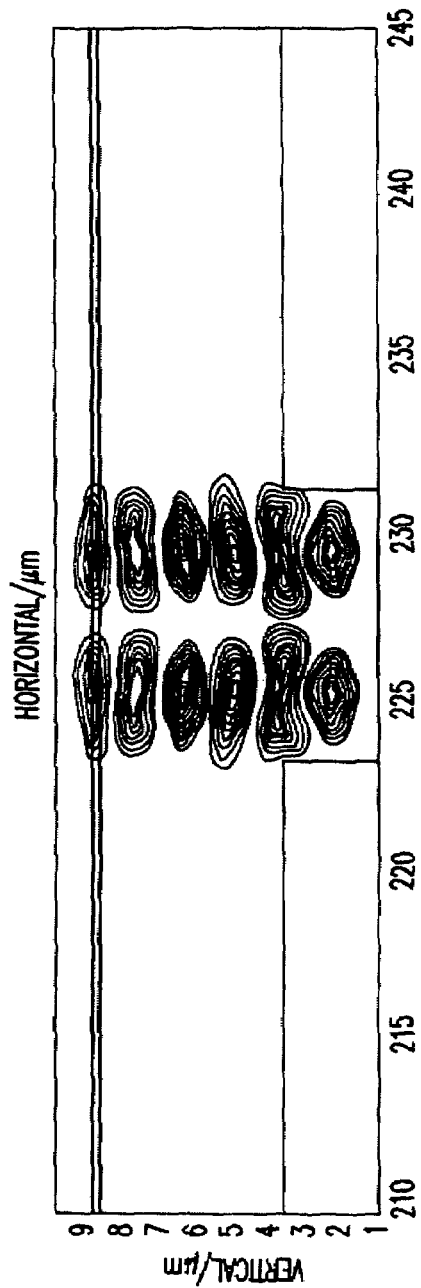

LARGE MODAL VOLUME SEMICONDUCTOR LASER SYSTEM WITH SPATIAL MODE FILTER

RELATED APPLICATIONS

This application is a Continuation of U.S. application Ser. No. 10/055,872 filed on Jan. 23, 2002 now U.S. Pat. No. 6,804,281 which claims benefit of provisional application No. 60/263,683 filed on Jan. 23, 2001, both of which are incorporated herein by reference in their entirety.

BACKGROUND OF THE INVENTION

Conventional edge-emitting semiconductor devices such as lasers and semiconductor optical amplifiers (SOA's) usually comprise a substrate, on which epitaxial layers of varying alloy compositions, carrier types and carrier densities have grown. These various layers are used to define the optical waveguide and the gain region of the device, which are designed to support amplification and emission of radiation in a single spatial mode. Typically, for high power devices, the dimensions of the cross-sectional area of the single spatial mode are a few micrometers in the direction parallel to the epitaxial layers (the lateral direction) and a fraction of a micrometer perpendicular to those layers (the transverse direction).

SUMMARY OF THE INVENTION

For many applications, it would be useful if the dimensions of the mode could be made larger in both the lateral and transverse directions, and particularly in the transverse direction. Larger dimensions would lead to a reduction in the numerical aperture of the output beam, and the beam could be more nearly round, rather than being elliptical in cross-section with a large aspect ratio of the major to minor axes. These larger mode sizes and shapes would be especially attractive when the optical output of the semiconductor device is to be coupled into a single-mode optical fiber.

The disjunction between the mode size of a typical semiconductor laser and the mode size in the optical fiber necessitates coupling optics, such as discrete lenses and fiber lenses, to expand the mode when coupling from a semiconductor laser to fiber, or shrink the mode when coupling from fiber to the semiconductor laser or SOA.

Fundamentally, the achievement of a larger mode size in a waveguide that supports only a lowest-order, single spatial mode is a design dilemma. For a symmetric 2-dimensional slab wave-guide, single-spatial-mode propagation can occur only if the following inequality is satisfied:

$$(\Delta n)n < 0.5(\lambda/W)^2, \qquad \text{Eq. 1.1}$$

where n is the index of the slab, W is its width, $\lambda$ is the free-space wavelength, and $\Delta n$ is the difference between the slab index and its cladding index.

If the mode dimension W is on the order of 5 to 10 micrometers, as is found in common single mode fiber, then $\Delta n$ (assuming that $\lambda \sim 1$ micrometer and $n \sim 3.5$) must be less than about 0.006. Such small index differences are nearly impossible to obtain accurately by choosing different alloy compositions, because variations in temperature, carrier density, or gain and loss can easily cause larger changes in the effective value of the index, or overwhelm the real index differential via gain guiding (imaginary part of the index differential).

In three-dimensional waveguides, the geometry is generally more complicated and a simple relation such as Eq. 1.1 cannot be universally obtained. Nonetheless, it is approximately true that, for a symmetric, more or less rectangular wave-guide geometry, a relationship similar to Eq. 1.1 applies independently for each of the lateral and transverse directions with characteristic waveguide dimensions $W_L$ and $W_T$ and with suitably defined index differentials $\Delta n_L$ and $\Delta n_T$. (More precisely, Eq. 1.1 holds when the wave-guide is symmetric in both directions and the wave equation is separable in the two variables).

Very small index differentials can be obtained in the lateral direction using a stripe waveguide structure, such as a ridge waveguide, where the index differential is determined by an effective index approximation. This mathematical approximation is the consequence of a geometric structure that is achieved by constructing a lateral stripe (usually by etching grooves or entirely removing material on either lateral side of the stripe that extends on the optical axis of the device) into a heterostructure of stacked layers of varying index. In this manner, it is possible to produce sufficiently small, controllable index differentials so that truly single spatial mode operation in the lateral direction can be obtained for mode widths up to 2 to 4 micrometers.

In the transverse direction, however, the index variations are tied to band gap variations that must have minimal differentials to achieve appropriate carrier confinement within the gain region of the structure. Some have proposed designs that have modal widths up to about 2 micrometers in the transverse direction—if the gain region is positioned near the null of the next higher mode, the structure can effectively support only the lowest order spatial mode. The next mode, though a proper mode of the structure, has very low gain. With this strategy, the right-hand side of Eq. 1.1 may be multiplied by an additional factor of $2^2$, to allow for the next propagating (but low-gain) mode. Then for a 2-micrometer transverse width, the maximum index differential can be as large as about 0.1, a value compatible with adequate carrier confinement.

Nonetheless, even with these efforts, mode size matching between the single mode fiber and the edge-emitting stripe waveguide semiconductor chip is still suboptimal.

In order to go beyond the limitations of conventional structures, as described above, it is necessary to use modified waveguides that support a few higher-order spatial modes, or may even be highly overmoded waveguides. The flexibility, afforded by this approach, in the geometry of the waveguide structure allows for better optimization of the mode shape and can yield less critical dimensional control.

The present invention concerns a design that uses a single-mode fiber angle-coupled to a semiconductor waveguide medium with optical gain. This design is particularly simple and relevant to optical fiber systems, but it may be generalized to include other implementations as well, in which other single-mode filters are employed. A core realization behind the invention surrounds the fact that external cavity systems with tilted facet semiconductor active devices are generally thought to be impracticable because large facet angles, i.e., greater than 7 degrees, are required to prevent self-oscillation between the facets of the semiconductor waveguide medium. At such angles, the resulting coupling efficiency is usually unacceptably low. However, when chip designs are utilized that support lowest order modes of sizes greater than about 5 micrometers (µm), much smaller facet angles can be employed while still avoiding self-oscillation. More specifically, according to some aspects of the invention, facet angles of less than 4–5 degrees are utilized.

The present invention utilizes a much larger mode size thereby reducing the angle required to avoid self-oscillation. This small angle in combination with the large mode size yields high coupling efficiency (i.e, greater than 80%) without intervening optics such as microoptics or fiber lenses. As a result, efficient laser operation is achieved with the single mode fiber providing intracavity spatial mode filtering, which ensures that the laser power is carried predominantly in the large mode of the semiconductor waveguide.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIGS. 6a–6c include contour plots of higher-order modes that have very low values of $C_m$.

DETAILED DESCRIPTION OF THE PREFERRED EMBODIMENTS

This teaching of U.S. provisional patent application No. 60/263,683, filed Jan. 23, 2001, are hereby incorporated by this reference.

Figure 1:
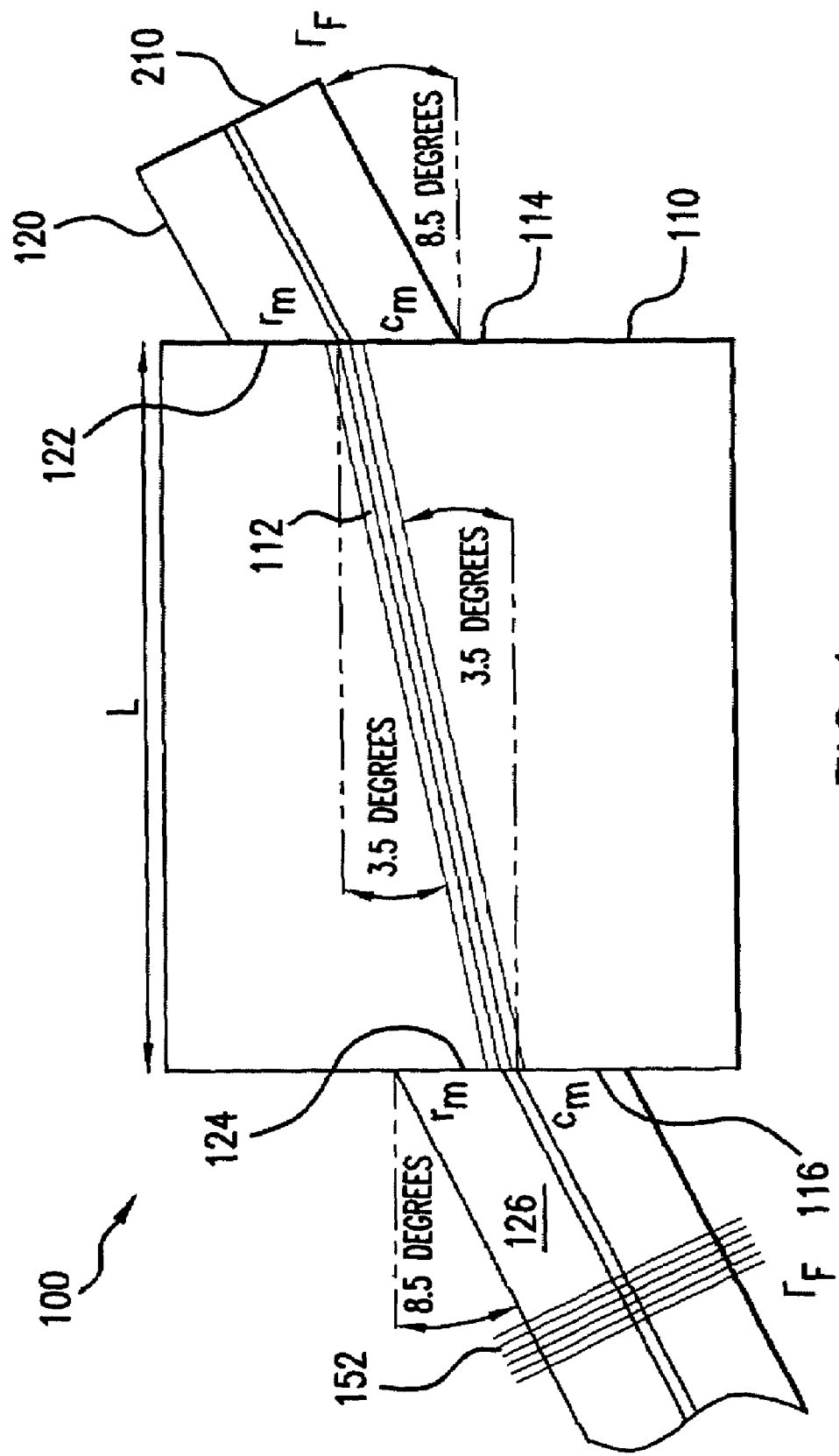
FIG. 1 is a schematic cross-sectional view of an external cavity semiconductor laser system, according to the present invention, having double-ended spatial mode filtering.

FIG. 1 shows an external cavity semiconductor laser system 100, which has been constructed according to the principles of the present invention.

Generally, the laser 100 comprises a semiconductor chip 110. This chip has a stripe 112, such as a ridge waveguide, which has been etched or otherwise formed in the epitaxial layers of the bulk material of the chip 110. The stripe 112 defines the optical axis.

In one implementation, the chip utilizes a trench-defined ridge. In alternative embodiments, the epitaxial layers on either lateral side of the ridge are entirely removed as in another common ridge configuration. In still other embodiments, stripes defined by regrowth or other processes are used.

According to the invention, the chip 110 is configured to generate a mode that is greater than 5 micrometers in diameter in both the transverse and lateral directions. Note, the outside edge or perimeter of the mode is defined as the contour where the intensity is a value that is $\exp(-2)=13.5\%$ of its maximum value. This large mode size yields a number of advantages.

First, the large mode size provides good coupling efficiency to single mode fiber because the mode size of the chip is matched to the size of the mode in the fiber. That is, the cross-sectional area of the fiber core and the semiconductor waveguide are closely matched. Specifically, in one implementation, LEAF brand fiber by Corning Incorporated is used, which has a mode size of approximately 6 micrometers.

In the preferred embodiment, the chip has a tilted facet configuration. That is, the ridge centerline does not form a 90-degree angle with the first and/or second facets 114, 116 at the wafer planes, which typically formed by cleaving, etching or polishing the chip bulk.

A result of this tilted facet configuration is that it avoids self-oscillation of the chip 110 itself. Any radiation reflected at the plane interfaces at the first and second facets 114, 116 is reflected at an angle relative to the optical axis defined by the ridge 112, thus avoiding self-oscillation.

A second advantage associated with the large mode size results from the combination with the tilted facet—the angles required to avoid self-oscillation are much smaller. This yields further increases in the coupling efficiency. Thus, according to the preferred embodiment, facet angles of less than 5 degrees are used. Specifically, in one embodiment, the angles are less than 4 degrees or approximately 3.5 degrees.

A back reflector system providing spatial mode filtering is provided at the first facet 114 of the chip 110.

Preferably, a single mode fiber pigtail 120 is coupled to the facet 114. As common, in tilted facet coupling configurations, the fiber endface 122 is polished or cleaved at an angle to prevent the creation of a parasitic laser cavity at the fiber endface interface. In the preferred embodiment, the angle is less than 10 degrees or about 8.5 degrees.

Adequate discrimination exists against higher order modes reflected from an angled facet, where the angle is about 3.5 degrees (corresponding to a glass fiber that is polished at an angle of about 8 degrees to butt couple to the lowest order mode in the chip). Even for very high order modes, for 1 micrometer wavelength and a total mode width of 6 micrometers, the analysis indicated that the highest possible reflectivity occurred for a third order mode where it was about 0.00003.

In contrast, in order to get the same level of modal discrimination from an angled facet for modes that are only about 2.5 micrometers wide, angles of the facet relative to the waveguide of about 7 or 8 degrees are required. This translates to a very large angle in air of about 25 to 30 degrees. These requirements together with reduced overall chip-fiber coupling efficiency practically rule-out using this technique for external cavity modal discrimination in conventional chip designs.

Generally, an angle of about 7 degrees is thought to be necessary to eliminate reflections, feedback at the semiconductor output facet. The required angle, however, is a function of the mode size. Snell's law, which makes the external angle a nonlinear function of the internal angle:

sin(theta2)=(n1/n2)sin(theta1). This causes the external angle (in air) to more than double when the internal angle is doubled.

In the preferred embodiment, the fiber endface 122 is butt coupled or near butt coupled (i.e., without intervening bulk optics) to the input facet.

With the present invention the endface can be separated from the input facet by up to 10 micrometers and still achieve acceptable coupling efficiencies because of the lower diffraction associated with the large mode.

In fact in some embodiments, an index matching filler is inserted between the fiber endface 122 and the first facet 114. In some implementations, epoxies such as those used with Mach-Zender modulators are used. The large mode size generally avoids catastrophic optical damage (COD) at the facet because of the lower concomitant optical power intensities.

It is also possible to use external bulk/micro optical components such as lenses and mirrors of various types with or without fiber lenses. Although, except in laboratory tests, it is unlikely that bulk components are desirable due to the resulting increase in device manufacturing cost.

The output facets 114, 116 of the semiconductor waveguide 110 are preferably optically coated to have an antireflection (AR) coating that is matched to the glass index of the fiber. This will work particularly well if epoxy is used around and in the butt-coupled joint, where the epoxy can be chosen to have an index closely matched to the glass fiber. Alternatively, the AR coating on the facet is made to match air. Then the butt-coupled end of the fibers must also be AR coated to match air. This allows for the possibility that a small air gap, which can be necessary or desirable, as in the case of "near butt coupling" between the semiconductor facet and the fiber, depending upon packaging techniques used.

A distal end 210 of the pigtail 120 defines the back reflector of the laser cavity. In the preferred embodiment, this distal end is coated to be highly reflecting. In one implementation, the HR coating on fiber end 210 is a dielectric, multi-layer mirror. Alternatively, a grating(s) internal to the fiber is used as the back reflector.

It is also possible to use external bulk optical components such as lenses and mirrors of various types, although, except in laboratory tests, it is unlikely that bulk components are desirable. Nevertheless, micro-optic components, as opposed to bulk components, might be useful options.

The endface 124 of the output fiber 126 is coupled to the second facet 116 preferably using the same or similar coupling strategy as described relative to the first facet 114. In the preferred embodiment, the butt coupling, or near butt coupling, technique is used, with or without filler. Specifically, the fiber is polished at the angle of less than 10 degrees or about 8.5 degrees.

An output mirror reflector 152 is provided along the length of the output fiber 126. In the preferred embodiment, the reflector 152 is a fiber Bragg grating providing less than 15% power reflectively. In one implementation, the grating provides relatively broadband reflection of greater than 0.8 nanometers bandwidth. This configuration is useful in some pump applications.

Alternatively, the grating has a narrow bandwidth of less than 100 MegaHertz, for narrowband applications.

In the preferred embodiment, the laser system 100 functions as a high power laser. Specifically, in the preferred embodiment, the chip length L is relatively long, i.e., that is greater than 1 centimeter to as long as 2.5 centimeters.

The residual power reflectivity at the semiconductor-fiber interface is labeled as $r_m$, where the subscript m denotes the order of the semiconductor wave-guide spatial mode, and more generally may include two integer subscripts that represent the number of lobes in the transverse and lateral directions. $C_m$ is the power-coupling coefficient, which also depends upon the spatial mode m, and $\Gamma_b$ and $\Gamma_f$ are the "voltage" reflectivities at the ends of the external cavity (as opposed to the power reflectivities $R_b=|\Gamma_b|^2$, and $R_f=|\Gamma_f|^2$).

There is only one propagating mode in the fibers 120, 126; so there are no modal indices (m) for the reflectivities, $\Gamma_b$ and $\Gamma_f$, the subscripts b and f simply indicate that these reflectivities may chosen to have different values at the back and front facets, the output end of the cavity generally having a small reflectivity (we will choose this as $\Gamma_f$) and the other end having a reflectivity ($\Gamma_b$) preferably approaching unity.

Figure 2:
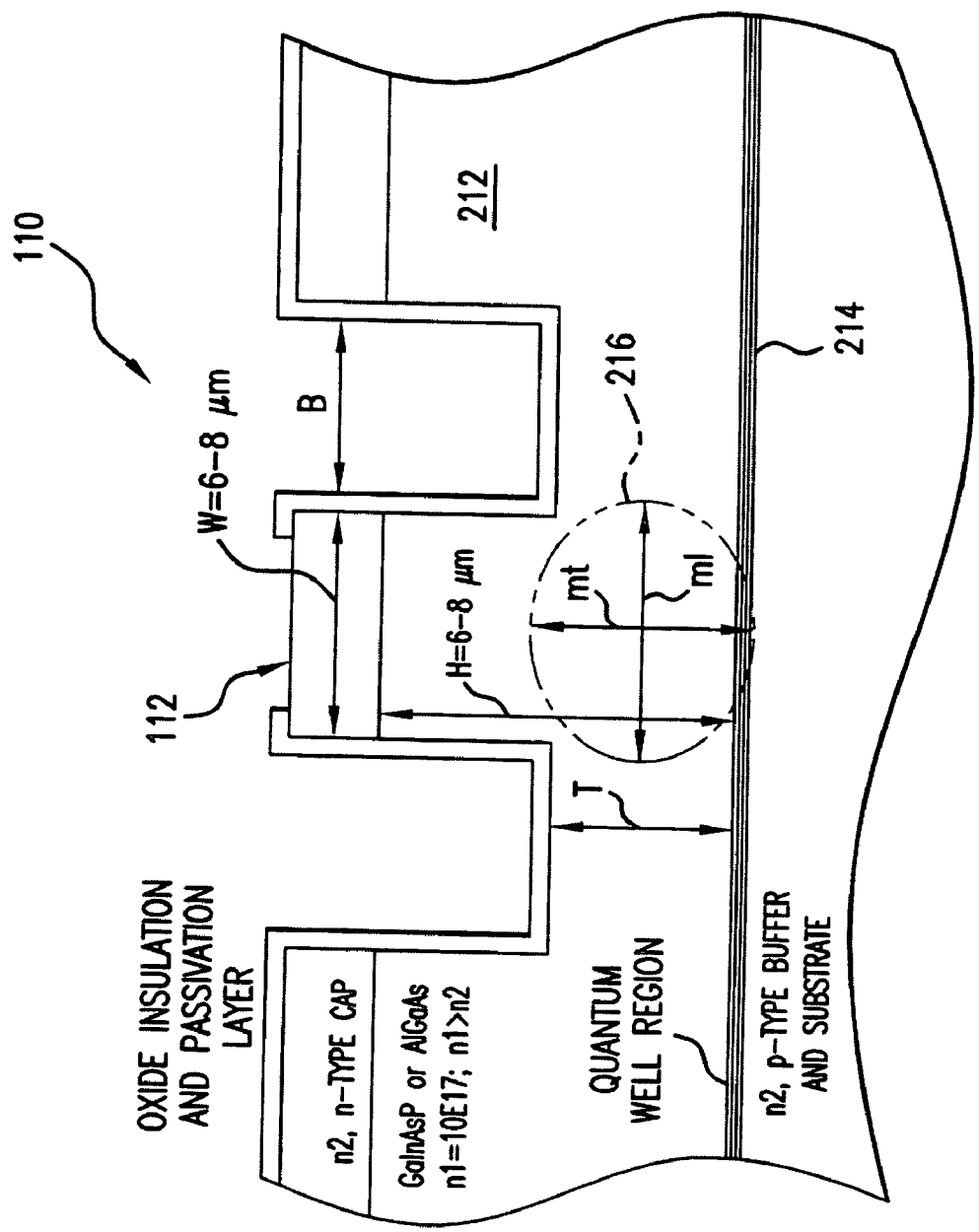
FIG. 2 is a schematic cross-sectional view of a semiconductor optical amplifier chip according to an embodiment of the present invention.

FIG. 2 is a cross-sectional view of one embodiment of the chip 110 that will produce the large modes utilized in the present invention.

Specifically, in the preferred embodiment, a ridge waveguide stripe system is used. Specifically, a ridge 112 is etched or otherwise formed in epitaxial layers 212.

The waveguide region is preferably n-type material to contain free carrier absorption enabling a relatively long chip length.

The mode is not centered on the active region 214 in order to further decrease free carrier absorption and reduce gain guiding. In fact, in the preferred embodiment, less than 20%, preferably less than 8%, of the lowest order mode 216 overlaps with the active layer 214. This reduces gain but also keeps losses small, thereby avoiding the gain-guiding problem.

According to the invention, the chip is configured for high gain, at the expense of spatial mode control. Typically, in the preferred embodiment, the chip is, in fact, "over-moded". Thus, if configured as a laser with reflecting end facets, it would generate higher order modal output in addition to the $TEM_{00}$ mode.

The threshold condition for any mode m is that the cavity round-trip net gain be equal to unity. Although it will be shown later that the mode of the composite structure, which includes the semiconductor waveguide and the external fiber cavities, is a superposition of several waveguide modes (a so-called "supermode"), for the moment it is useful to ignore this complication and assume that each spatial mode of the semiconductor waveguide can be treated as a separate entity. In this case, the threshold condition is expressed below in Eq. 2.1, where $g_m$ is the net gain coefficient for the mode m, i.e., $g_m=\gamma_m-\alpha_m$, with $\gamma_m$ being the modal gain coefficient, $\alpha_m$ is the modal loss coefficient, and L is the gain length of the semiconductor. (For the large-mode-size waveguides, discussed here, the loss coefficient can vary significantly with the mode m).

$$\exp(2g_m L)|\Gamma_b \Gamma_f|^2 C_m^4 = 1. \qquad \text{Eq. 2.1}$$

In writing Eq. 2.1, the reflectivity $r_m$ has been neglected since it is very small for all modes because of the large mode sizes and the angled facet. It is important that we know how small $r_m$ is, because the higher-order modes of the waveguide often have larger gain than the lowest-order mode, and we have to eliminate the possibility that they may reach threshold due to the residual feedback from $r_m$. In other words, the feedback must be sufficiently small that the following inequality is satisfied for any mode with net gain:

$$\exp(2g_m L) r_m^2 < 1. \qquad \text{Eq. 2.2}$$

The solution of Eq. 2.1 for the threshold gain in the external cavity is $$g_m = 1/L[\ln(1/C_m^2) + \ln(1/R_b R_f)^{1/2}]. \quad \text{Eq. 2.3}$$

The threshold gain in the internal cavity is from Eq. 2.2

$$g_m = 1/L[\ln(1/r_m)]. \quad \text{Eq. 2.4}$$

Since $R_b$ and $R_f$ are not dependent on the waveguide mode, all of the modal discrimination must arise from the dependence of $C_m$ on the spatial mode of the waveguide. Hence it is critical to establish what this dependence is. For this purpose we have modeled waveguides that have the geometry of FIG. 2. Values for the dimensions labeled by W and H in that figure, which give good coupling for the lowest-order mode but poor coupling for higher-order modes, are W~H~6 to 8 micrometers. The value of B is typically about 1.5 to 2 micrometers and has little effect on the wave-guiding parameters. These typical dimensions, in general, provide good coupling of the lowest-order mode with the fiber mode. The value of T has an important influence on the number of other modes that can propagate without net loss. It is also important in determining the relative gain of the various modes and can be chosen to give the best compromise available between all the parameters of interest. There is no obvious design procedure to determine the "best" values. Rather waveguide modeling (including gain and loss) must be carried out in a systematic fashion. The values of W, H, and T that have been used for the model discussed in the following analysis for a 980-nm wavelength laser are (in micrometers): W=8, H=7.15, and T=5.28. In order to enhance the gain in the lowest-order spatial mode, the layer of thickness, Δ=0.1 micrometers, has been included in the wave guiding region on the p-type side of the quantum-well region, as shown in FIG. 2. These values were used for a structure in which the n-type cap region and the p-type buffer region are composed of the alloy $Al_xGa_{1-x}As$ with x=0.3, and both of the waveguide regions are composed of $Al_xGa_{1-x}As$ with x=0.18. These aluminum fractions correspond to index values at 980 nm of $n_1$=3.405 and $n_2$=3.34.

Generally, the chip has low gain per unit length, to limit gain-guiding effects (causing more competing spatial modes) as well as self-focusing effects (causing beam distortions and instabilities at high power density). Low gain (low confinement factor) enables very large modal volumes without these problems. Also it is true that low gain is a result of having large modal volume.

Figure 3:
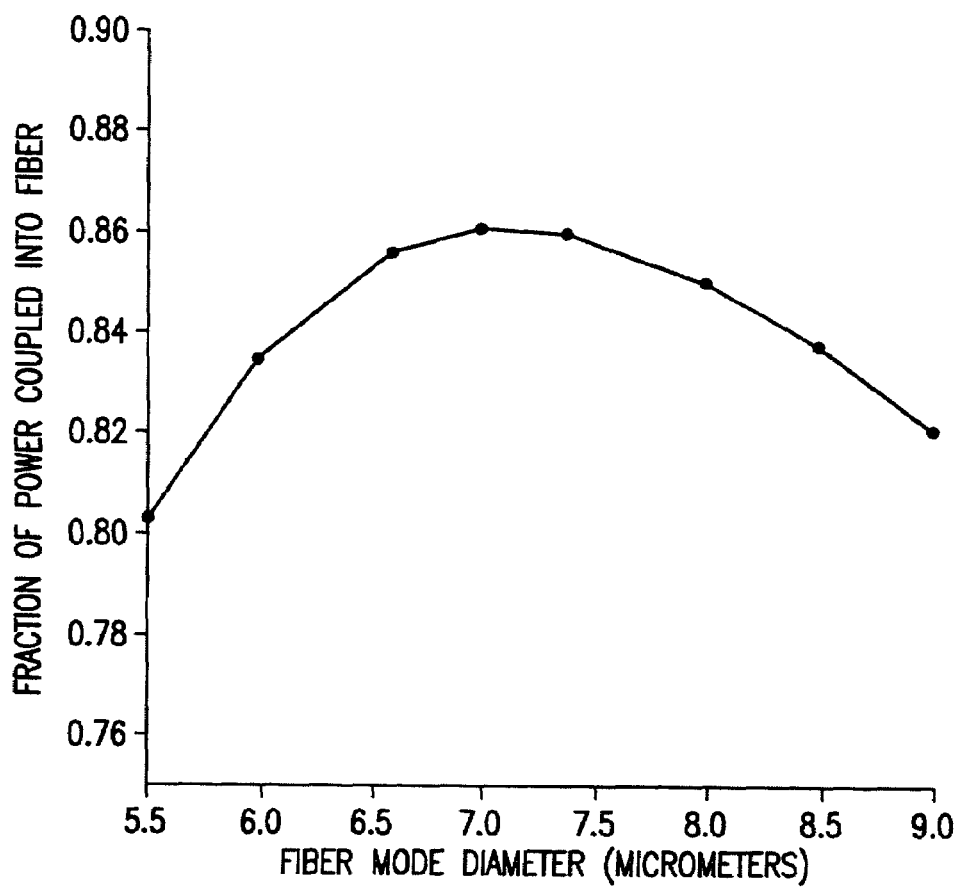
FIG. 3 is a plot of coupling efficiency of the lowest-order mode $C_{11}$ as a function of fiber mode diameter.
Figure 4A:
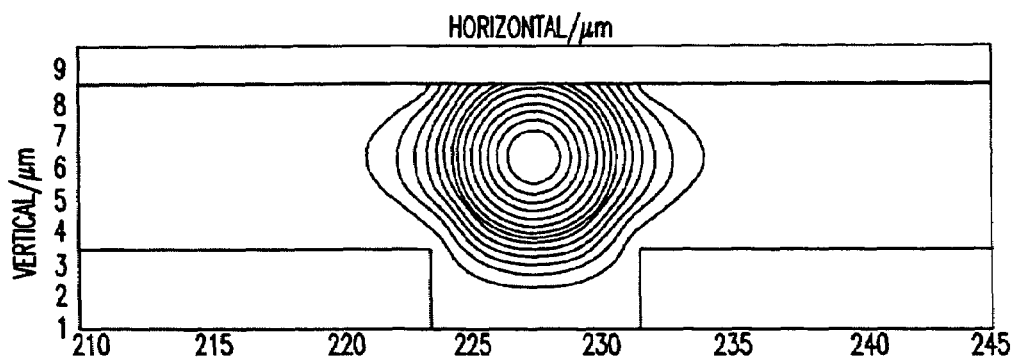
FIGS. 4a–4d include contour intensity plots of chip modes having net gain in one implementation, note this figure shows the chip 110 in a ridge-down orientation.
Figure 4B:
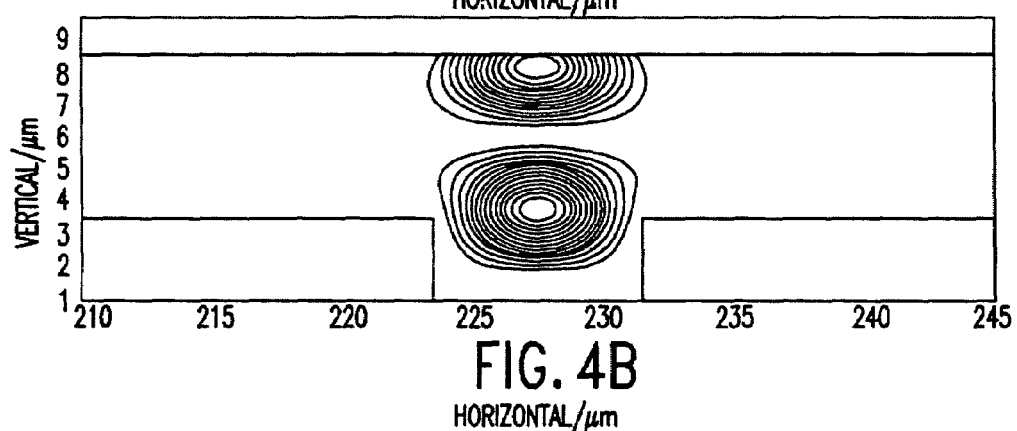
Figure 4C:
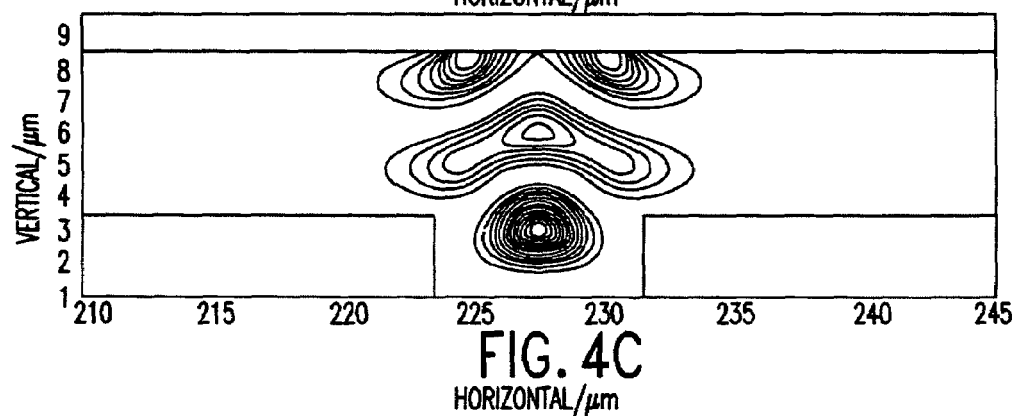
Figure 4D:
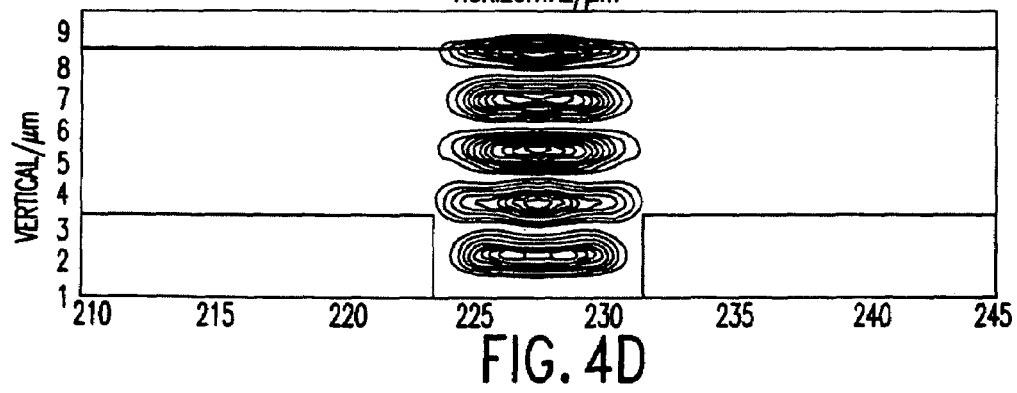

FIG. 3 shows the coupling of the lowest-order mode $C_{11}$ as a function of the fiber mode diameter. The largest value, 0.861, occurs for about a 7-micrometer fiber mode diameter. Note that the subscript 11 indicates one intensity lobe in the transverse direction and one intensity lobe in the lateral direction. Depending on the implementation and codesign of the chip 110 and with fiber selection, the design dimensions are adjusted to achieve a maximum coupling efficiency of about 85% for any mode diameter from about 5.5 micrometers to about 9 micrometers.

FIGS. 4a–4d show modes having net gain, for the design parameters discussed above and near the modeled current density of 600 A/cm². The mode with indices 31 is also shown, although it has a small net loss at 600 A/cm². This mode is particularly interesting and it is well confined to the ridge region, having little coupling to the slab region. A mode with three intensity lobes in the transverse direction and one lobe in the lateral direction is likely, by symmetry, to have relatively large coupling to the fiber compared to other modes, except the lowest-order mode. The coupling of mode $C_{31}$ is small for the case that we modeled, probably because it is not truly a mode with one intensity lobe in the lateral direction. There is a more complicated structure in the intensity pattern, as seen in FIGS. 4a–4d. We find that among $C_{31}$=0.000135, $C_{21}$=0.0394, and $C_{51}$=0.00183, $C_{21}$ is surprising large and this mode turns out to have the lowest threshold except for the lowest-order mode.

If the lowest-order mode reaches threshold before any of the other modes show net gain, they are effectively prevented from oscillation, since the population inversion tends to become clamped above threshold near its threshold value. Still it is important to have as large a separation between the threshold of the lowest-order mode and the others since the clamping of the population is never complete, due to various effects.

For estimates of the residual modal reflectivities $r_m$ at the angled facets, a simple lossless (gainless) analytic model having a high degree of symmetry has been used. This model predicts that the residual reflectivity varies from about −60 dB for the lowest-order mode up to as large as −44 dB for some of the higher-order modes. These numbers are similar to those obtained for a few numerically calculated examples. For the present problem we use −60 dB for the lowest-order mode and −44 dB for all the higher order modes. For a gain length L=1 cm, the corresponding values of $1/L[\ln(1/r_m^2)]$ is about 10.23 cm$^{-1}$ and 13.821 cm$^{-1}$, respectively for −60 dB and −44 dB. In general, a successful design will require checking $r_m$ and $C_m$ for all the modes that show a positive net gain near the threshold for the lowest-order mode to be sure that the necessary values can be demonstrated. Both of these quantities can be calculated by an overlap integral of the calculated modes with themselves after reflection from the angled facet (for $r_m$) and by an overlap integral of calculated modes with the fiber mode (for $C_m$).

Figure 5:
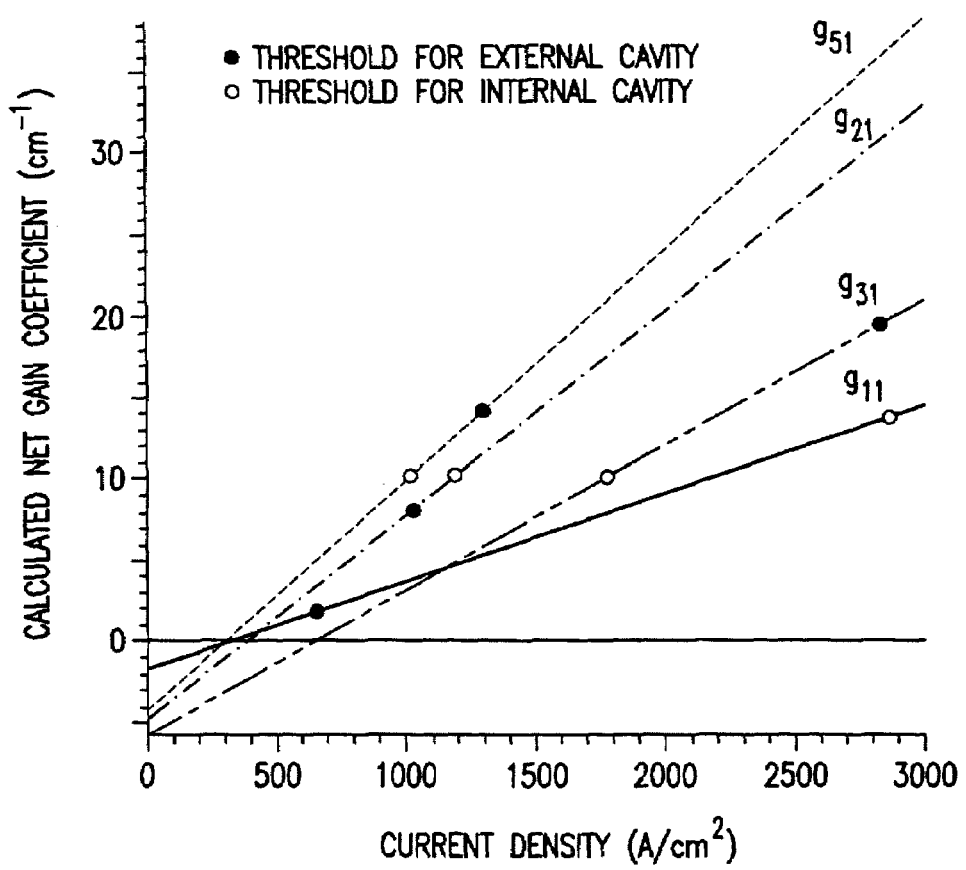
FIG. 5 show plots of net gain as a function of current density.

In order to more clearly demonstrate the suppression of higher-order modes, we have calculated the gain vs. current density for the modes shown in FIGS. 4a–4d. To do this we have used published values of transparency current density and of gain versus current density per quantum well for 980-nm structures, which have quantum well regions similar to the ones we model. By comparing the relative optical confinement factors for the published results with those for the modes shown in FIGS. 4a–4d, it is possible to predict the curves shown in FIG. 5, assuming that the gain can be modeled as linear with current density, i.e., $g_m = \Gamma_m^* g_o (J/J_t - 1) - \alpha_m$, where $\Gamma_m$ is the optical confinement factor, $g_o$ is a constant, J is the current density, and $J_t$ is the transparency current density. Finally, the thresholds for the various modes are marked by the solid circles for the external cavity operation and by the open circles for the internal cavity operation. In this example the threshold for external cavity operation of the lowest-order mode is lower than any other threshold by about 370 A/cm².

Figure 6C:
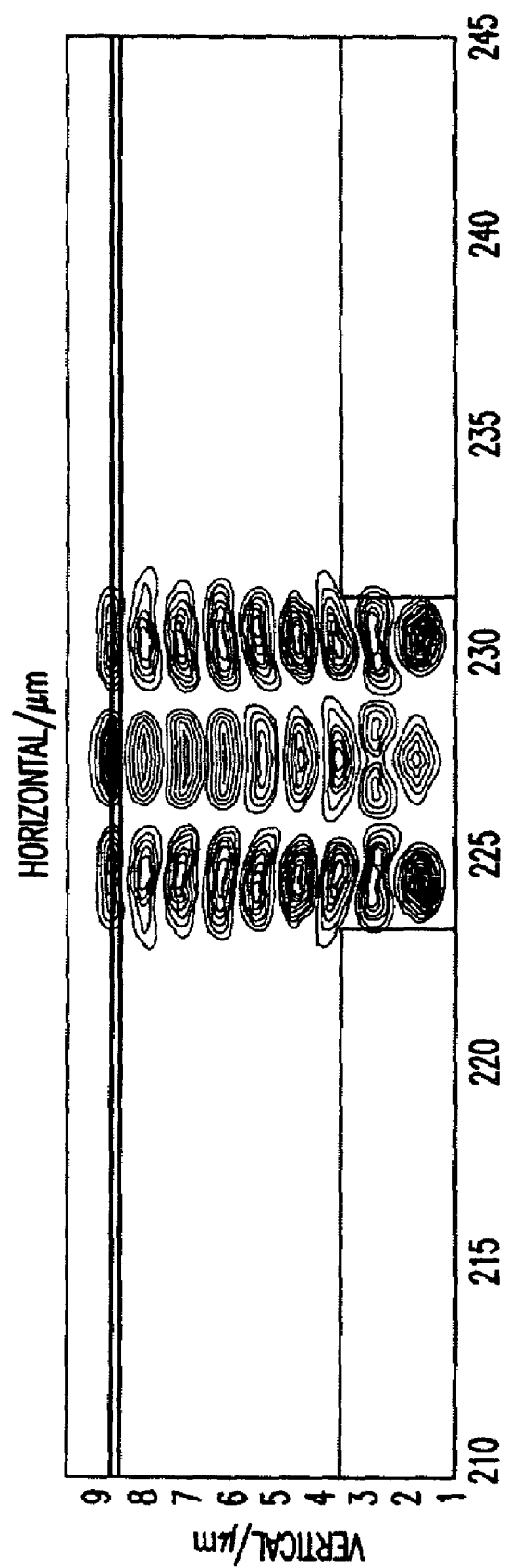

Other modes can be found using the mode solving software, but only those that are reasonably tightly bound to the ridge region have potential for low threshold operation. Some modes of this type are shown in FIGS. 6a–6c. These higher-order modes have very low values of $C_m$ and would not oscillate in the external cavity. They also have low gain vs. current density and will not oscillate in the internal cavity, either.

Figure 7:
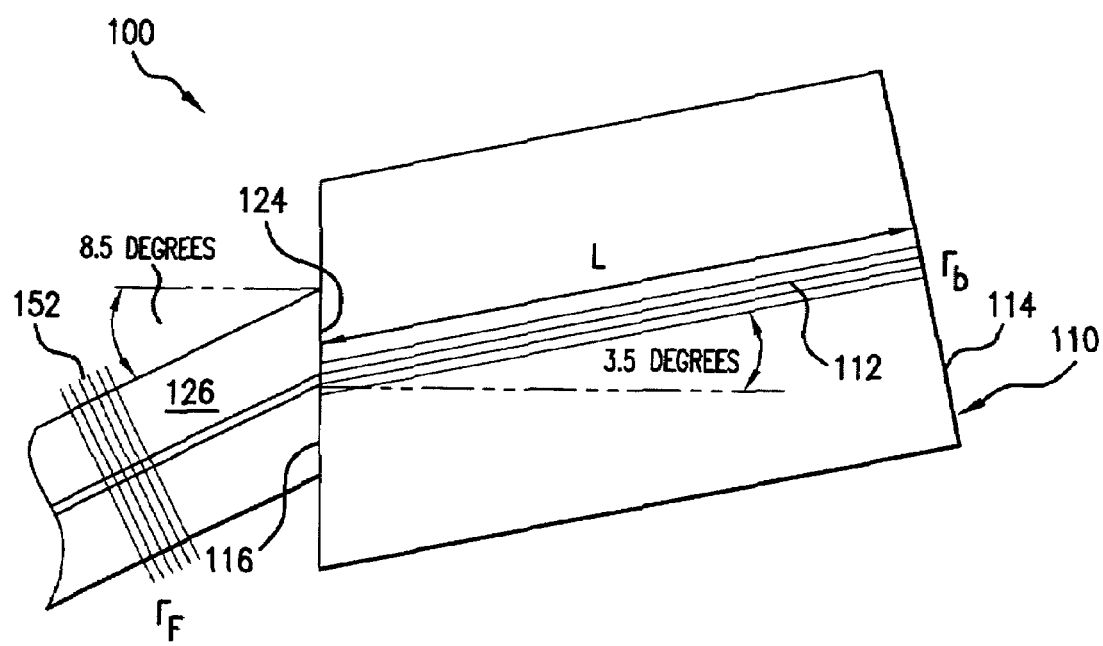
FIG. 7 is a schematic block diagram of a semiconductor laser system according to a second embodiment of the present invention.

FIG. 7 shows another embodiment of a laser system of the present invention.

The parameters of this embodiment are generally similar to those described previously in the design of the chip 110 of FIG. 1.

In this "one-ended" version, the first facet 114 is HR coated to function as a back reflector of the laser cavity.

Preferably, the first facet forms a 90 degree angle with the laser stripe 112. In one implementation, the first facet is polished at the desired 90 degree angle. In other embodiments, it is formed by etching, such as reactive ion etching (RIE), or a cleaving process.

The second facet 116 is tilted with respect to the stripe. Preferably, the angling is as described previously, i.e., a facet angle of less than 5 degree is used, with angles of less than 4 degrees to approximately 3.5 degrees being used in some embodiments. The single mode fiber pigtail 126 is coupled to the facet 116. Endface 124 is polished or cleaved at an angle to prevent the creation of a parasitic laser cavity at the fiber endface interface. In the preferred embodiment, the angle is less than 10 degrees or about 8.5 degrees.

The Bragg grating 152 functions as the output reflector of the laser.

The FIG. 7 embodiment, being one-ended, has advantages in ease of packaging. Generally, however, it is somewhat less robust with respect to multi spatial mode operation since a spatial mode filter is present at only one end of the chip 110.

FIG. 7 is also used as the foundation for the following analysis concerning any detrimental impact from supermodes on power tracking for example.

In the figure, the coefficients $\Gamma_f$ and $\Gamma_b$ are voltage reflectivities rather than power reflectivities. For simplicity we can think of a gain medium that supports only a few modes (say, three), but it does not matter how many modes may be present in general. Also we are considering the propagation of beams in an external cavity that includes a fiber at one end, only, of the gain medium. (Generally, the results here are similarly applicable to the double-ended version of FIG. 1.)

As a matter of definition, for each spatial mode (mode index m), we will have a complex propagation constant $\gamma_m = \beta_m + i\alpha_m/2$. We also assume that the three hypothetical modes have amplitudes of $A_1$, $A_2$, and $A_3$ (in general $A_m$). The amplitude of the mode in the fiber is $A_0$. If initially the amplitudes incident from the gain medium onto the fiber are $A_m{}^a$, then $A_0 = \Sigma_m c_{m0} A_m{}^a$, where $c_{m0}$ is the overlap of mode m with the fiber mode (in general a complex number). These amplitudes are shown schematically in the figure as an aid for this discussion. The mode returning from the fiber back into the gain medium has the amplitude $\Gamma_f A_0$, and excites the following amplitudes in the spatial modes of the gain medium:

$$A_m{}^b = \Gamma_f A_0 c_{0m} = \Gamma_f c_{0m} \Sigma_n c_{n0} A_n{}^a. \qquad \text{Eq. 3.1}$$

As indicated in the figure, the superscript b labels the mode amplitudes that are excited by the return signal from the external fiber cavity. If we follow the modes as they propagate through the gain medium, reflect from the back facet, and return to the fiber interface, we can see that the effect is to multiply each mode by a factor of $$\Gamma_b \exp(i2\gamma_n L). \qquad \text{Eq. 3.2}$$

Hence, the mode amplitudes that arrive back at the fiber interface (labeled by the superscript c) are $$A_m{}^c = \Gamma_b \Gamma_f c_{0m} \Sigma_n \exp(i2\gamma_n L) c_{n0} A_n{}^a \qquad \text{Eq. 3.3a}$$

$$= d_m \Sigma_n b_n A_n{}^a \qquad \text{Eq. 3.3b}$$

where we note in Eq. 3.3b that $\Gamma_b \Gamma_f c_{0m} \equiv d_m$ is a complex constant that depends only on the mode index m and that $\exp(i2\gamma_n L) c_{n0} = b_n$ is also a complex constant that depends only on the mode index n. Now we note that from Eq. 3.3b, $$A_m{}^c / d_m = \Sigma_n b_n A_n{}^a = K, \qquad \text{Eq. 3.4}$$

where K is a (complex) constant, independent of mode index, since it is a sum over all mode indices. Hence we can choose to set the initial amplitudes of the modes in the gain medium as follows:

$$A_m{}^a = d_m K = \Gamma_b \Gamma_f c_{0m} K. \qquad \text{Eq. 3.5}$$

This choice will give us a "super" eigenmode of the system that results from the combination of the gain medium with the external cavity. Supermodes must result from the coupling of the original eigenmodes of the gain medium by the external cavity. The supermode we have found consists of the original spatial modes, with relative amplitudes and phases determined by $c_{0m}$. This means that there will be no problem with interference between the spatial modes as they couple into the fiber 126, since their relative amplitudes and phases are fixed by the coupling of the fiber mode to each spatial mode, which is a constant to a high degree of approximation. This supermode also clearly can be made the lowest threshold supermode, since it has power in each of the spatial modes that is proportional to the square of $c_{0m}$. For the situations we have analyzed, $(c_{01})^2$ is more than 0.85 for the lowest spatial mode and only a few percent for any other spatial mode. We also know that the lowest-order spatial mode can be chosen by waveguide design to have a large positive gain.

To investigate the threshold condition for this supermode, we can substitute Eq. 3.5 into the right-hand side of Eq. 3.3a and equate the result to 3.3b. The following equation results:

$$d_m K = d_m K \Gamma_b \Gamma_f \Sigma_n \exp(i2\gamma_n L) c_{0n} c_{n0}. \qquad \text{Eq. 3.6}$$

Since $c_{n0} = c_{0n}{}^*$, we obtain the threshold condition, after canceling the common factor on each side of the equation, $$\Gamma_b \Gamma_f \Sigma_n \exp(i2\Gamma_n L) c_{n0}{}^2 = 1. \qquad \text{Eq. 3.7}$$

In $\Gamma_f$ we have absorbed the phase shift associated with round-trip propagation through the fiber to the reflector and any phase shift associated with reflection from a DBR grating or other reflective component that may be used for this reflector. If $c_{n0}$ is zero for all $n \neq 1$, then Eq. 3.7 reduces to the familiar equation for threshold of a laser, except that the loss associated with the coupling efficiency being less than unity is included, viz., $$\exp(-\alpha_1 L) = 1/[\Gamma_b \Gamma_f c_{10}{}^2], \qquad \text{Eq. 3.8a}$$

and $$2\beta_1 L = -\Phi + 2m\pi, \qquad \text{Eq. 3.8b}$$

where m is an integer, and $\Phi$ is the phase angle associated with $\Gamma_b \Gamma_f$. The phase includes the round-trip propagation in the fiber, $2\beta_0 L_0$, where $L_0$ is the length in the fiber with propagation constant $\beta_0$. Writing $-\alpha_1$ as $g_1$ and defining $\Gamma_b \Gamma_f$ as $\sqrt{R_b R_f}$ yields the more familiar expression for Eq. 3.8a shown below.

$$g_1 = 1/L \{\ln[1/\sqrt{R_b R_f}] + \ln[1/c_{10}{}^2]\}. \qquad \text{Eq. 3.9}$$

While this invention has been particularly shown and described with references to preferred embodiments thereof, it will be understood by those skilled in the art that various changes in form and details may be made therein without departing from the scope of the invention encompassed by the appended claims.

What is claimed is:

1. A semiconductor optical system, comprising
   an edge-emitting, stripe-waveguide semiconductor chip having a first tilted facet and second tilted facet located at either end of the stripe, the chip generating a lowest order spatial mode that is greater than 5 micrometers in diameter;

a first waveguide having an endface positioned opposite the first tilted facet; and a second-waveguide having an endface positioned opposite the second tilted facet;

wherein the first tilted facet and the second tilted facet are angled relative to an axis of the stripe to prevent self oscillation of the semiconductor chip.

2. A semiconductor optical system as claimed in claim 1, wherein the first tilted facet and the second tilted facet are angled relative to an axis of the stripe by less than 5 degrees.

3. A semiconductor optical system as claimed in claim 1, wherein the first tilted facet and the second tilted facet are angled relative to an axis of the stripe by about than 4 degrees.

4. A semiconductor optical system as claimed in claim 1, wherein the first waveguide and the second waveguide are single mode optical fiber.

5. A semiconductor optical system as claimed in claim 1, wherein the first waveguide and the second waveguide function as spatial mode filters controlling the distribution of power among the multiple spatial modes of the semiconductor chip.

6. A semiconductor optical system as claimed in claim 1, wherein the endfaces of the first waveguide and the second waveguide are butt coupled to the first tilted facet and the second tilted facet, respectively.

7. A semiconductor optical system as claimed in claim 1, wherein a length of the stripe is greater than 5 millimeters.

8. A semiconductor optical system as claimed in claim 1, wherein a length of the stripe is greater than 10 millimeters.

9. A semiconductor optical system as claimed in claim 1, wherein a length of the stripe is greater than 20 millimeters.

10. A semiconductor optical system as claimed in claim 1, wherein lowest order spatial mode that is greater than 6 micrometers in diameter.

11. A semiconductor optical system as claimed in claim 1, wherein lowest order spatial mode that is greater than 9 micrometers in diameter.

12. A semiconductor optical system as claimed in claim 1, wherein first tilted facet and second tilted facet are anti-reflection coated.

13. A semiconductor optical system as claimed in claim 1, wherein the edge-emitting stripe waveguide semiconductor chip is overmoded.

14. A semiconductor optical system as claimed in claim 1, wherein the first fiber pigtail includes a Bragg grating that functions as an output mirror.

15. A semiconductor optical system as claimed in claim 14, wherein the second waveguide includes a reflector functioning as a laser cavity back reflector.

16. A semiconductor optical system, comprising an edge-emitting, stripe-waveguide semiconductor chip having a tilted front facet and a highly reflecting back facet, the chip generating a lowest order spatial mode that is greater than 5 micrometers in diameter;

an output mirror through which a laser output beam is coupled; and a spatial mode filter, between the output mirror and the front facet of the chip, that preferentially distributes the power into the large, lowest order mode of the semiconductor chip;

wherein the tilted front facet is angled relative to an axis of the stripe to prevent self-oscillation of the semiconductor chip.

17. A semiconductor optical system as claimed in claim 16, wherein the tilted front facet is angled relative to an axis of the stripe by less than 4 degrees.

18. A semiconductor optical system as claimed in claim 16, wherein the spatial mode filter is a single mode optical fiber and the output mirror is a fiber Bragg grating.

19. A semiconductor optical system as claimed in claim 16, wherein a length of the stripe is greater than 10 millimeters.

* * * * *